(12) United States Patent
Okazaki

(10) Patent No.: US 12,207,503 B2
(45) Date of Patent: Jan. 21, 2025

(54) DISPLAY DEVICE

(71) Applicant: SHARP KABUSHIKI KAISHA, Sakai (JP)

(72) Inventor: Shoji Okazaki, Sakai (JP)

(73) Assignee: SHARP KABUSHIKI KAISHA, Sakai (JP)

( * ) Notice: Subject to any disclaimer, the term of this patent is extended or adjusted under 35 U.S.C. 154(b) by 643 days.

(21) Appl. No.: 17/280,133

(22) PCT Filed: Sep. 28, 2018

(86) PCT No.: PCT/JP2018/036348
§ 371 (c)(1),
(2) Date: Mar. 25, 2021

(87) PCT Pub. No.: WO2020/065932
PCT Pub. Date: Apr. 2, 2020

(65) Prior Publication Data
US 2021/0343812 A1    Nov. 4, 2021

(51) Int. Cl.
*H10K 59/124* (2023.01)
*H10K 50/84* (2023.01)
*H10K 59/121* (2023.01)
*H10K 59/131* (2023.01)

(52) U.S. Cl.
CPC ......... *H10K 59/124* (2023.02); *H10K 50/841* (2023.02); *H10K 59/1213* (2023.02); *H10K 59/131* (2023.02)

(58) Field of Classification Search
CPC ............... H10K 59/124; H10K 50/841; H10K 59/1213; H10K 59/131
See application file for complete search history.

(56) References Cited

U.S. PATENT DOCUMENTS

2008/0224599 A1*  9/2008  Kim .................... H10K 59/124
                                                                           445/24
2009/0021154 A1   1/2009  Aota
2014/0319474 A1   10/2014 Kim et al.
(Continued)

FOREIGN PATENT DOCUMENTS

CN    109411629 B  *  2/2021  ......... H01L 27/3244
CN    108519696 B  *  4/2021  ........... G02F 1/1333
(Continued)

*Primary Examiner* — Fernando L Toledo
*Assistant Examiner* — Jahae Kim
(74) *Attorney, Agent, or Firm* — ScienBiziP, P.C.

(57) ABSTRACT

A display device includes: a resin layer; a thin film transistor layer formed on the resin layer, the thin film transistor layer including a first inorganic insulating film and a second inorganic insulating film; a light-emitting element layer; and a sealing layer, the display device including a display region and a frame region surrounding the display region, wherein the first inorganic insulating film and the second inorganic insulating film are each formed of one type of an inorganic insulating film or two or more types of layered inorganic insulating films, the second inorganic insulating film is layered on the first inorganic insulating film, in the frame region, a first slit is formed in the first inorganic insulating film, a second slit is formed in the second inorganic insulating film, and the first slit and the second slit are not superimposed on each other.

19 Claims, 6 Drawing Sheets

(56) References Cited

U.S. PATENT DOCUMENTS

| | | |
|---|---|---|
| 2015/0060778 A1 | 3/2015 | Kim et al. |
| 2015/0183932 A1 | 7/2015 | Katayama et al. |
| 2016/0013253 A1* | 1/2016 | Lee .................. C23C 16/50 83/13 |
| 2016/0244565 A1 | 8/2016 | Katayama et al. |
| 2017/0162822 A1 | 6/2017 | Park et al. |
| 2017/0240707 A1 | 8/2017 | Katayama et al. |
| 2018/0130862 A1 | 5/2018 | Kim et al. |
| 2020/0119116 A1 | 4/2020 | Kim et al. |
| 2022/0028946 A1* | 1/2022 | Kim ................ H10K 59/873 |

FOREIGN PATENT DOCUMENTS

| | | | |
|---|---|---|---|
| JP | 2009049001 A | 3/2009 | |
| JP | 2015050181 A | 3/2015 | |
| JP | 2018132768 A | 8/2018 | |
| KR | 102009330 B1 * | 12/2017 | ........... H10K 50/844 |

* cited by examiner

DISPLAY DEVICE

TECHNICAL FIELD

The disclosure relates to a display device.

BACKGROUND ART

For display devices used for various display applications, in recent years, development of display devices in which a support substrate is replaced with a resin from a glass substrate in the related art has progressed to achieve reduction in thickness and weight, improvement in flexibility, and the like. The display device has a layered structure in which a thin film transistor (hereinafter, referred to as "TFT") layer, a light-emitting element layer, a sealing layer, and the like are layered on a support substrate (for example, see PTL 1 below).

CITATION LIST

Patent Literature

PTL 1: JP 2018-132768 A (published on Aug. 23, 2018)

SUMMARY

Technical Problem

In the related art, cracks that occur in the layered structure are problematic. When cracks occur in the layered structure, starting from this, the cracks may progress independently through the interior of the plurality of films forming the layered structure for each film. FIG. 6 is a schematic view illustrating a progression of cracks generated in a layered structure including two layers of inorganic insulating films 101 and 102 provided in a frame region of a display device 100 in the related art. In the drawing, DA indicates a display region. As indicated by arrows in the drawing, cracks independently progress through the interior of the inorganic insulating films 101 and 102 from a start point illustrated in FIG. 6.

Such progress of cracks causes dark spots in the display region and causes poor display, and it is necessary to be suppressed.

The disclosure has been made in view of the above problems, and an object of the disclosure is to provide a display device that suppresses progression of cracks in films forming a layered structure of the display device for each film to improve reliability.

Solution to Problem

In order to solve the above-described problems, a display device according to an embodiment of the disclosure includes: a resin layer; a thin film transistor layer formed on the resin layer, the thin film transistor layer including a first inorganic insulating film and a second inorganic insulating film; a light-emitting element layer; and a sealing layer, and the display device includes a display region and a frame region surrounding the display region. The first inorganic insulating film and the second inorganic insulating film are each formed of one type of inorganic insulating film or two or more types of layered inorganic insulating films. The second inorganic insulating film is layered on the first inorganic insulating film. A first slit is formed in the first inorganic insulating film, and a second slit is formed in the second inorganic insulating film in the frame region, and the first slit and the second slit are not superimposed on each other.

Advantageous Effects of Disclosure

According to an aspect of the disclosure, it is possible to provide a display device that suppresses progression of cracks, for each film, in different films forming a layered structure of the display device to improve reliability.

BRIEF DESCRIPTION OF DRAWINGS

FIG. 1 (c) is a plan view near line L3-L4 of FIG. 1 (a), and FIG. 1 (d) is a view illustrating only a first inorganic insulating film, a second inorganic insulating film, a first slit and a second slit in the cross-sectional view along line L3-L4 of FIG. 1 (a). FIG. 1 (e) is a diagram illustrating an aspect in which a flattening film is formed to cover the second inorganic insulating film, the first slit, and the second slit illustrated in FIG. 1 (d).

FIG. 3 (b) is a cross-sectional view illustrating a cross-section B of FIG. 2. FIG. 3 (c) is a cross-sectional view illustrating a cross-section C of FIG. 2.

FIG. 5 (b) is a cross-sectional view of the display device according to the third embodiment, illustrating only a first inorganic insulating film, a second inorganic insulating film, an organic layer, a first slit, a second slit, a fifth slit, and a resin layer. FIG. 5 (c) is a view illustrating an aspect in which a flattening film is formed to cover the second inorganic insulating film, the organic layer, the second slit, and the fifth slit illustrated in FIG. 5 (b).

DESCRIPTION OF EMBODIMENTS

Figure 1:
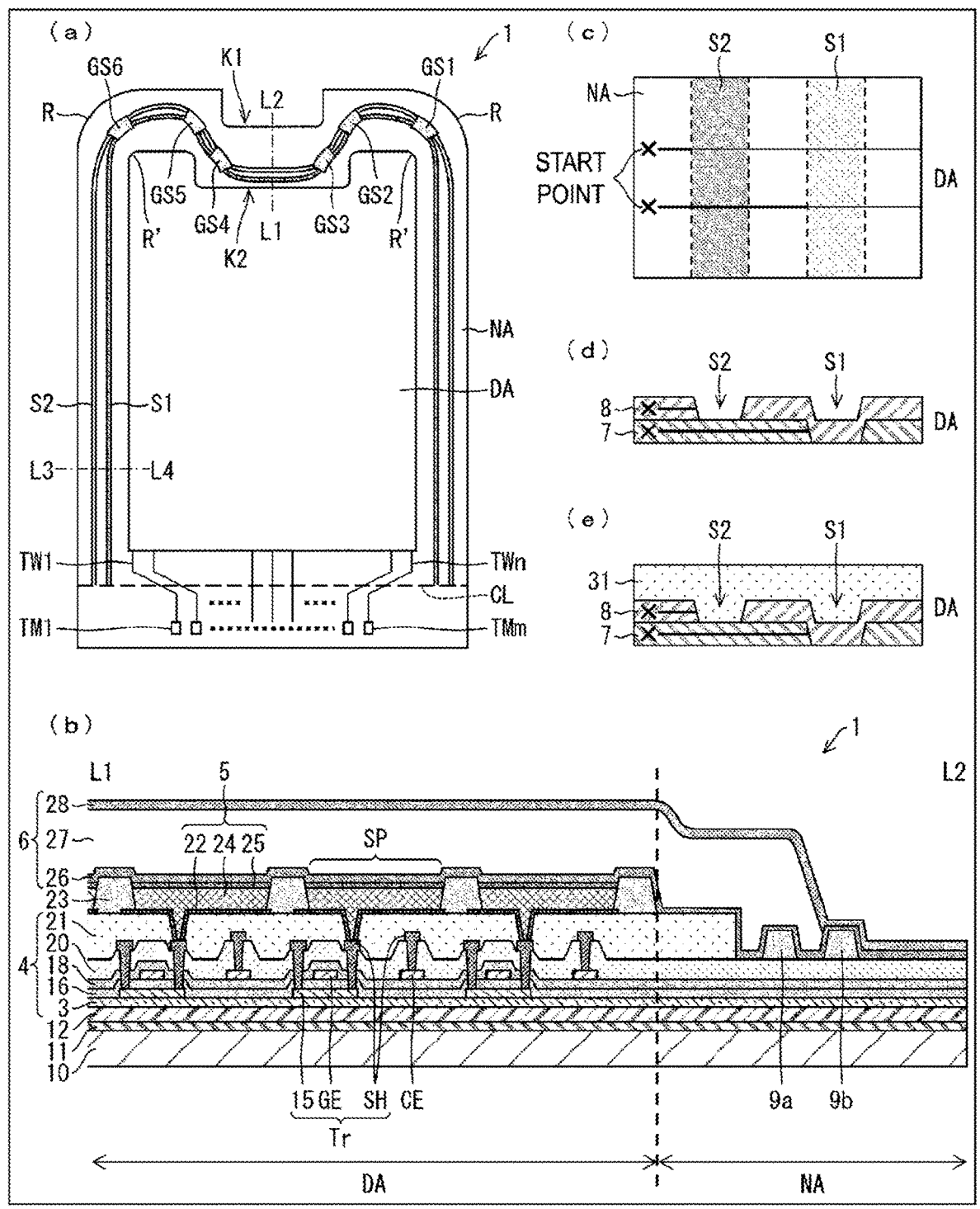
FIG. 1 (a) is a plan view of a display device of a first embodiment, and FIG. 1 (b) is a cross-sectional view along line L1-L2 illustrated in FIG. 1 (a).

Embodiments of the disclosure will be described below with reference to FIG. 1 to FIG. 5. Hereinafter, for convenience of description, components having the same functions as those described in a specific embodiment are denoted by the same reference numerals, and descriptions thereof may be omitted.

Note that, in the embodiments below, as an example of a display device, a case in which a display device provided with an organic light-emitting diode (OLED) is used will be described, but the disclosure is not limited thereto, and the display device may be provided with an inorganic light emitting diode or a quantum dot light emitting diode (QLED).

First Embodiment

A display device according to an embodiment of the disclosure includes: a resin layer; a thin film transistor layer formed on the resin layer, the thin film transistor layer including a first inorganic insulating film and a second inorganic insulating film, a light-emitting element layer, and a sealing layer, and the display device is provided with a display region and a frame region surrounding the display region. The first inorganic insulating film and the second inorganic insulating film are each formed of one type of inorganic insulating film or two or more types of layered inorganic insulating films, the second inorganic insulating film is layered on the first inorganic insulating film, a first slit is formed in the first inorganic insulating film and a second slit is formed in the second inorganic insulating film in the frame region, and the first slit and the second slit are not superimposed on each other.

A display device 1 of a first embodiment of the disclosure will be described below with reference to FIG. 1 to FIG. 3. (a) of FIG. 1 is a plan view of the display device 1, and (b) of FIG. 1 is a cross-sectional view taken along line L1-L2 illustrated in (a) of FIG. 1. However, in (b) of FIG. 1, a first slit and a second slit are omitted. (c) of FIG. 1 is a plan view near line L3-L4 of (a) of FIG. 1, and (d) of FIG. 1 is a view illustrating only a first inorganic insulating film, a second inorganic insulating film, a first slit, and a second slit in the cross-sectional view taken along line L3-L4 illustrated in (a) of FIG. 1, and (e) of FIG. 1 is a view illustrating an aspect in which a flattening film is formed to cover the second inorganic insulating film, the first slit, and the second slit illustrated in (d) of FIG. 1.

1, Configuration Other than Slits in Display Device 1

As illustrated in (a) of FIG. 1, the display device 1 includes a display region DA and a frame region NA surrounding the display region DA. The display region DA includes corner portions R' and notch portions K2 that are deformed portions, and the frame region NA includes corner portions R and notch portions K1 that are deformed portions. Also, the frame region NA is provided with lead wiring lines TW1 to TWn that are electrically connected to terminal sections TM1 to TMm.

As illustrated in (b) of FIG. 1, in the display region DA, a base substrate 10 is attached to a lower face of a resin layer 12 via an adhesive layer 11. Meanwhile, on an upper face of the resin layer 12, a TFT layer 4, a light-emitting element layer (an organic EL element layer) 5, and a sealing layer 6 are formed.

An example of the material of the base substrate 10 includes polyethylene terephthalate (PET), but the material is not limited thereto.

Examples of the adhesive layer 11 include an optical clear adhesive (OCA) or an optical clear resin (OCR), but are not limited thereto.

Examples of the material of the resin layer 12 include a polyimide resin, an epoxy resin, and a polyamide resin, but are not limited thereto.

The TFT layer 4 is layered on the resin layer 12. The TFT layer 4 includes a base coat film (a barrier layer) 3 that is an inorganic film, a semiconductor film 15, a gate insulating film 16 that is an inorganic insulating film and is an upper layer than the semiconductor film 15, a gate electrode GE that is an upper layer than the gate insulating film 16, a first interlayer insulating film 18 that is an inorganic insulating film that is an upper layer than the gate electrode GE, a capacitance wiring line CE that is an upper layer than the first interlayer insulating film 18, a second interlayer insulating film 20 that is an inorganic insulating film that is an upper layer than the capacitance wiring line CE, a source electrode and drain electrode SH that is an upper layer than the second interlayer insulating film 20, and an interlayer insulating film 21 that is an upper layer than the source electrode and drain electrode SH.

Note that the gate electrode GE, the capacitance wiring line CE, the source electrode and drain electrode SH, and the like, can be formed by a method such as sputtering or the like.

The base coat film 3 is a layer to prevent moisture or impurities from reaching the TFT layer 4 or the light-emitting element layer 5 and can be formed of, for example, a silicon oxide film, a silicon nitride film, a silicon oxynitride film, or a layered film of these, which are formed using CVD.

Note that a capacitance element includes a capacitance electrode included in the capacitance wiring line CE formed directly above the first interlayer insulating film 18, the first interlayer insulating film 18, and a capacitance counter electrode formed directly below the first interlayer insulating film 18 and superimposed on the capacitance electrode in the same layer as the layer that forms the gate electrode GE.

A thin film transistor element (TFT) Tr includes, as active elements, the semiconductor film 15, the gate insulating film 16, the gate electrode GE, the first interlayer insulating film 18, the second interlayer insulating film 20, and the source electrode and drain electrode SH.

The semiconductor film 15 is formed of low-temperature polysilicon (UPS) or an oxide semiconductor, for example.

The gate electrode GE, the capacitance wiring line CE, and the source electrode and drain electrode SH are formed of a single-layer film or a layered film of a metal including at least one of aluminum (Al), tungsten (W), molybdenum (Mo), tantalum (Ta), chromium (Cr), titanium (Ti), copper (Cu), and silver (Ag), for example.

The gate insulating film 16, the first interlayer insulating film 18, and the second interlayer insulating film 20 may be formed of, for example, a silicon oxide (SiOx) film, a silicon nitride (SiNx) film, a silicon oxynitride film, or a layered film of these, which are formed by CYD.

The interlayer insulating film 21 may be formed of, for example, a coatable photosensitive organic material, such as a polyimide resin, an acrylic resin, or the like.

A plurality of data signal lines S(m) formed in the same layer as the source electrode and drain electrode SH in the display region DA, and a plurality of scanning signal lines G(n) and a plurality of light emission control lines Em(n) formed in the same layer as the gate electrode GE so as to intersect with the data signal lines are provided. In FIG. 1(a), the data signal lines are provided in a direction extending from the terminal sections TM1 to TMm to the display region DA. Furthermore, pixel circuits are provided in a matrix shape to correspond to intersections of the plurality of data signal lines S(m) and the plurality of scanning signal lines G(n).

In the frame region NA (the left and right sides of FIG. 1(a)) that intersects the scanning signal line G(n) and the light emission control line Em(n), a control circuit of a scanning control circuit that inputs a signal to the scanning signal line G(n) and a light emission control circuit that inputs a signal to the light emission control line Em(n) is provided between the display region DA and the first slit S1 or the second slit S2 on the side closer to the display region DA.

The light-emitting element layer 5 is provided with an anode 22 that is an upper layer overlying the interlayer insulating film 21, a bank 23 that covers an edge of the anode 22, an electroluminescence (EL) layer 24 that is an upper layer overlying the anode 22, and a cathode 25 that is an upper layer overlying the EL layer 24, and the light-emitting element layer 5 includes the anode 22, the EL layer 24, and the cathode 25 in an island shape for each subpixel SP. The bank (anode edge cover) 23 can be formed of a coatable photosensitive organic material, such as a polyimide resin or an acrylic resin, for example. The light-emitting element layer 5 forms the display region DA and is layered on the TET layer 4.

For example, the EL layers 24 are formed by layering a hole injection layer, a hole transport layer, a light-emitting layer, an electron transport layer, and an electron injection layer in this order, from the lower layer side. The light-emitting layer is formed in an island shape for each subpixel by a vapor deposition method or ink-jet method, but the other layers may be a solid common layer. In addition, one or more layers among the hole injection layer, the hole transport layer, the electron transport layer, and the electron injection layer may not be formed.

The anode (anode electrode) 22 is photoreflective and is formed by layering Indium Tin Oxide (ITO) and an alloy containing Ag, for example. The cathode 25 may be formed of a transparent conductive material such as indium Tin Oxide (ITO) or Indium Zinc Oxide (IZO).

Holes and electrons are recombined in the EL layer 24 by a drive current between the anode 22 and the cathode 25 in the light-emitting element layer 5, excitons generated thereby fall to the ground state, and thus, light is emitted, Because the cathode 25 is transparent and the anode 22 is light-reflective, the light emitted from the EL, layer 24 travels upward and becomes top-emitting.

The sealing layer 6 is transparent and includes a first inorganic seating film 26 that covers the cathode 25, an organic sealing film 27 that is formed on the first inorganic sealing film 26, and a second inorganic sealing film 28 that covers the organic seating film 27.

Each of the first inorganic sealing film 26 and the second inorganic sealing film 28 may be formed of, for example, a silicon oxide film, a silicon nitride film, or a silicon oxynitride film, or of a layered film of these, formed through CVD. The organic sealing film 27 is thicker than the first inorganic sealing film 26 and the second inorganic sealing film 28, is a transparent organic film, and can be formed of a coatable photosensitive organic material such as a polyimide resin or an acrylic resin.

In the frame region NA, a first frame-shaped bank (a first projection) 9a surrounding the display region DA in a frame shape and a second frame-shaped bank (a second projection) 9b surrounding the first frame-shaped bank 9a in a frame shape are provided on the second interlayer insulating film 20. In the case of the display device 1 illustrated in (b) of FIG. the organic sealing film 27 is formed to the inclined side surface on the left side of the second frame-shaped bank 9b, and thus, the first inorganic sealing film 26 and the second inorganic scaling film 28, which are inorganic films, are in direct contact with each other on the outer side of the inclined side surface on the left side of the second frame-shaped bank 9b and form a sealing layer.

The first frame-shaped bank 9a and the second frame-shaped bank 9b may be formed of a coatable photosensitive organic material, such as polyimide, acrylic, or the like. Also, the first frame-shaped bank 9a and the second frame-shaped bank 9b may be formed using the same material as the bank (anode edge cover) 23.

2. inorganic Insulating Film Provided in Display Device 1

The TFT layer 4 includes a first inorganic insulating film 7 and a second inorganic insulating film 8. The first inorganic insulating film 7 and the second inorganic insulating film are each formed of an inorganic insulating film included in the TFT layer 4.

The first inorganic insulating film 7 is formed of one type of inorganic insulating film or two or more types of layered inorganic insulating films of the inorganic insulating films of the TFT layer 4. In addition, the second inorganic insulating film 8 is formed of one type of inorganic insulating film or two or more types of layered inorganic insulating films layered on the first inorganic insulating films 7, of the inorganic insulating films of the TFT layer 4.

Thus, the first inorganic insulating film 7 may be formed of one type of inorganic insulating film or two or more types of layered inorganic insulating films, provided that the inorganic insulating film of the bottom layer of the second inorganic insulating film 8 is layered on the inorganic insulating film of the top layer of the first inorganic insulating film 7.

As illustrated in (b) of FIG. 1, the base coat film 3, the semiconductor film 15, the gate insulating film 16, the first interlayer insulating film 18, and the second interlayer insulating film 20 are provided from the lower layer toward the upper layer as the inorganic insulating films included in the TFT layer 4.

Thus, for example, in a case where the first inorganic insulating film 7 is formed of the base coat film 3, the second inorganic insulating film 8 may be formed of a layered film of the semiconductor film 15, the gate insulating film 16, the first interlayer insulating film 18, and the second interlayer insulating film 20 while the semiconductor film 15 disposed above the base coat film 3 is provided as the bottom layer. Furthermore, in the frame region in (b) of FIG. 1, the first inorganic insulating film 7 may be formed of the base coat film 3, and the second inorganic insulating film 8 may be formed of the gate insulating film 16, the first interlayer insulating film 18, and the second interlayer insulating film 20 while the gate insulating film 16 disposed above the base coat film 3 is provided as the bottom layer.

In another example, the first inorganic insulating film 7 is formed of the base coat film 3, the semiconductor film 15, and the gate insulating film 16, and the second inorganic insulating film 8 may be formed of the first interlayer insulating film 18 and the second interlayer insulating film 20 while the first interlayer insulating film 18 disposed above the gate insulating film 16 is provided as the bottom layer. Further, for example, the first inorganic insulating film 7 may be formed of the base coat film 3, the semiconductor film 15, the gate insulating film 16, and the first interlayer insulating film 18, and the second inorganic insulating film 8 may be formed of the second interlayer insulating film 20 which is one type of inorganic insulating film.

In this manner, the first inorganic insulating film 7 and the second inorganic insulating film 8 can be formed in a manner that satisfies the aforementioned requirements.

3. First and Second Slits Provided in Display Device 1

As illustrated in (a) of FIG. 1, in the frame region NA of the display device 1, a first slit S1 is formed in the first inorganic insulating film 7, a second slit S2 is formed in the second inorganic insulating film 8, and the first slit S1 and the second slit S2 are not superimposed on each other. In addition, the first slit S1 and the second slit S2 are formed so as to surround the display region DA, and the bending portion CL present between the display region DA and the terminal sections TM1 to TMm is defined as a termination portion.

In the bending portion CL, the slits are formed in the base coat film 3, the semiconductor film 15, the gate insulating film 16, the first interlayer insulating film 18, and the second interlayer insulating film 20, and the slits are filled with a resin film formed of a resin material such as polyimide. Wiring lines that electrically connect the terminals of the terminal section and the wiring lines of the display region are provided on the resin film.

As illustrated in (c) and (d) of FIG. 1, the first slit S1 can be formed by extracting a portion of the first inorganic insulating film 7 in the frame region NA, and the second slit S2 can be formed by extracting a portion of the second inorganic insulating film 8 in the frame region NA. As a method for extracting parts of the first inorganic insulating film 7 and the second inorganic insulating film 8, a method such as patterning (for example, photolithography) or the like can be used.

The first slit S1 and the second slit S2 are not superimposed on each other. That is, the first slit S1 and the second slit S2 are formed at different positions in the frame region NA, and are not superimposed on each other, as illustrated in (c) and (d) of FIG. 1.

As illustrated in (c) and (d) of FIG. 1, the first slit S1 and the second slit S2 are not superimposed on each other, and thus, from the starting points illustrated in (c) and (d) of FIG. 1, in the first inorganic insulating film 7 and the second inorganic insulating film 8, the progression of cracks (indicated in bold lines in the drawings) extending toward the display region DA can be suppressed by the portions where the first slit S1 and the second slit S2 are formed.

Additionally, by forming the first slit S1 and the second slit S2 so as to surround the display region DA, the progression of the cracks in the display region DA can be suppressed, and the generation of dark spots and poor display in the display region DA can be effectively suppressed.

Note that, in the display device 1 illustrated in (a) of FIG. 1, the merging slits GS1 to GS6 in which the first slit S1 and the second slit S2 are superimposed on each other are formed in a portion of the display device 1. As described below, this aspect is a preferred aspect of the disclosure, but is not limited thereto. In other words, an aspect in which the merging slit is not formed and the first slit S1 and the second slit S2 are not superimposed on each other in the entire display device 1 is also preferable so that the effects of suppressing the progression of cracks described above can be achieved.

The first slit S1 and the second slit S2 may both be on a side closer to the display region DA (in FIG. 1, the second slit S2 is located closer to the end portion of the display device 1 than the first slit S1), but the first slit S1 is preferably located closer to the end portion of the display device 1 than the second slit S2. FIG. 2 and FIG. 3 illustrate an example of an aspect in which the first slit S1 is located closer to the end portion of the display device 1 than the second slit S2.

Figure 3:
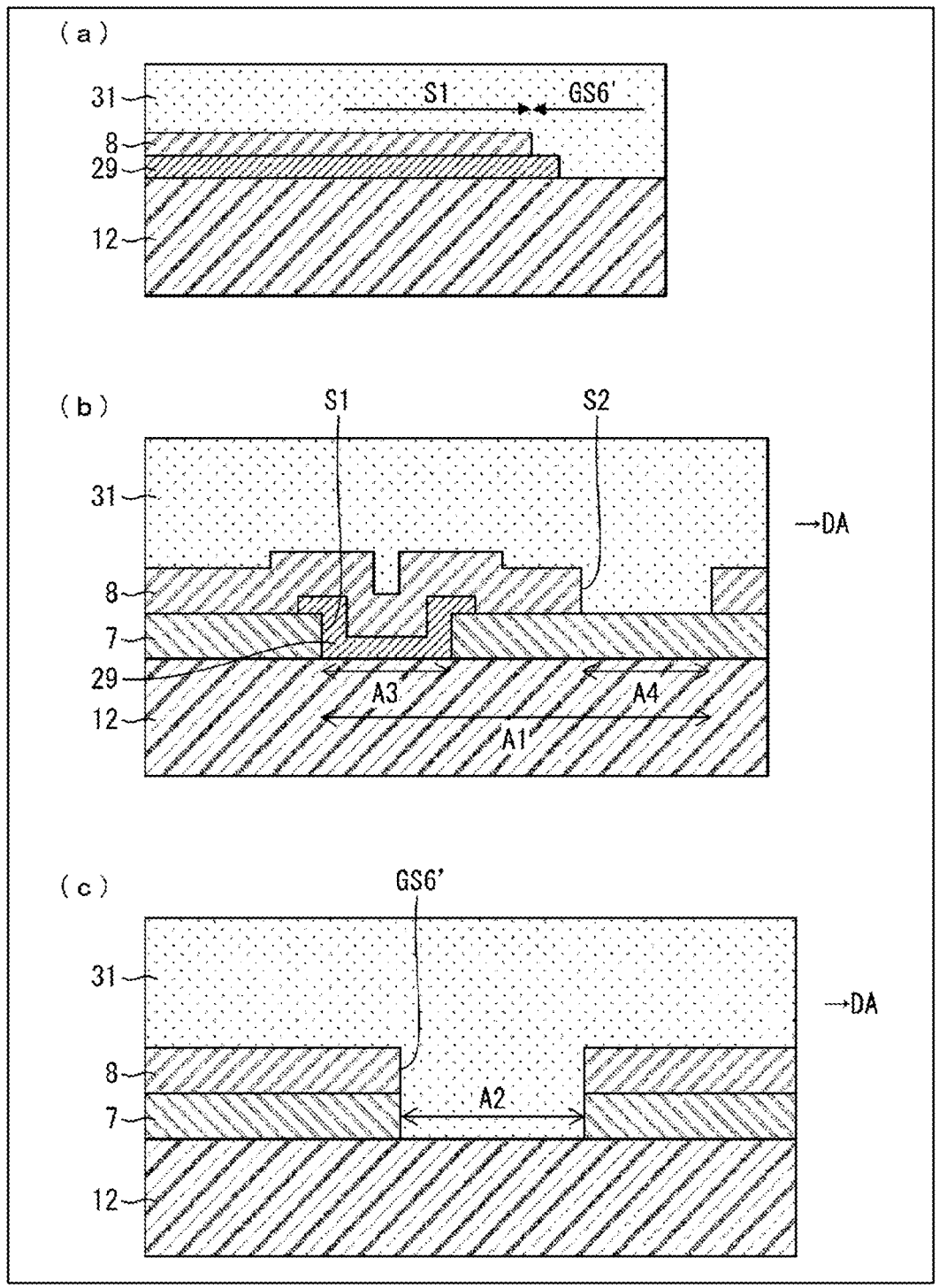
FIG. 3 (a) is a cross-sectional view illustrating a cross-section A of FIG. 2.

In this case, for example, even in a case where cracks progress inside the first inorganic insulating film 7 illustrated in (b) of FIG. 3 and the cracks are transmitted to the second inorganic insulating film 8 formed in the first slit S1, further progression of the cracks can be suppressed by the second slit S2.

4. Merging Slit

In the display device according to the embodiment of the disclosure, at least a portion of the display region has a deformed portion, and a portion of the first slit and a portion of the second slit are superimposed on each other to form a merging slit in the frame region between the deformed portion and an end portion of the display device.

In the present specification, the term "deformed portion" refers to a corner portion and a notch portion provided in the display region in a plan view of the display device when viewed from vertically above and a corner portion and a notch portion (each having a similar shape) provided in the frame region corresponding to the corner portion and the notch portion of the display region, respectively, and indicates a portion having a curved portion.

For example, the corner portion R' of the display region DA illustrated in (a) of FIG. 1, the notch portion K2, the corner portion R of the frame region NA, and the notch portion K1 correspond to the deformed portions. The notch portions K1 and K2 refer to the entire recessed portion illustrated in (a) of FIG. 1.

On the other hand, for example, such as a region near line L3-L4, which is a region below the corner portion R of the frame region illustrated in (a) of FIG. 1 does not correspond to the deformed portion and is referred to as a normal portion because the display region DA and the frame region NA do not have a curved portion. The display device may have at least one deformed portion because the display region DA needs to have the deformed portion in at least a part thereof. Note that the deformed portion having a curved portion may also be provided to the corner portion of the display region DA on the bending portion CL side.

"The end portion of the display device" refers to a portion that forms the outermost line of the display device in a plan view of the display device when viewed from vertically above. For example, in (a) of FIG. 1, the outermost line corresponds to the end portion of the display device 1.

Additionally, in the plan view, the "frame region between the deformed portion and the end portion of the display device" (hereinafter, referred to as "a region IK") refers to a frame region that is sandwiched between the deformed portion of the display region and a portion facing the deformed portion that is an end portion of the display device. For example, a portion of the frame region NA sandwiched between the corner portion R of the frame region NA illustrated in (a) of FIG. 1 and the corner portion R' of the display region DA facing the corner portion R (for example, a portion where the merging slits GS1 and GS6 are formed in the drawing), and a portion of the frame region NA sandwiched between the notch portion K1 and the notch portion K2, facing the notch portion K1, of the display region D1 (for example, the portion where the merging slits GS2 to GS5 are formed in the drawing) corresponds to the region IK.

"A portion of the first slit and a portion of the second slit are superimposed to form a merging slit" means that the first slit and the second slit, which are not superimposed on each other in other than the region IK, are superimposed in the region 1K to form a single slit. In (a) of FIG. 1, the merging slits indicated by GS1 to GS6 are formed in the region IK in the display device 1.

Figure 2:
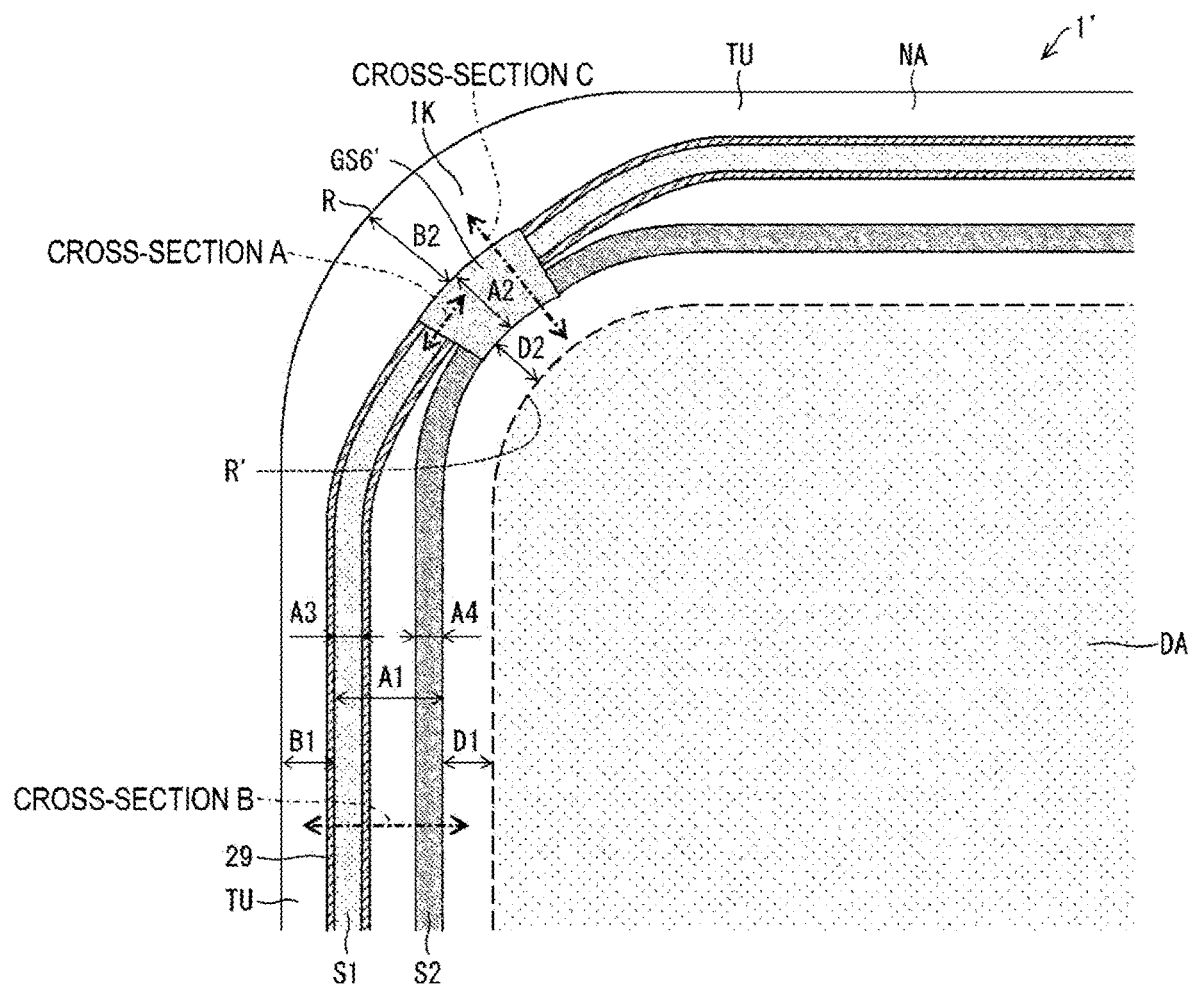
FIG. 2 is a view for specifically explaining a configuration of a merging slit and is an enlarged view of a portion of the display device in which the first slit is located closer to an end portion of the display device than the second slit.

FIG. 2 is a plan view for specifically explaining a configuration of the merging slit. Unlike FIG. 1, FIG. 2 is an enlarged view of a portion of a display device 1' in which the first slit S1 is located closer to an end portion of the display device than the second slit S2. In other words, the frame region NA (region IK) sandwiched between the corner portion R and the corner portion R', facing the corner portion R, of the display region DA and a normal portion TU in the vicinity thereof are illustrated. In a plan view of the display device 1' when viewed from vertically above, the normal portion TU is a frame region between the end portion of the display region DA that does not have a curved portion and the end portion of the display device 1'. (a) of FIG. 3 is a cross-sectional view illustrating a cross-section A of FIG. 2, (b) of FIG. 3 is a cross-sectional view illustrating a cross-section B of FIG. 2, and (c) of FIG. 3 is a cross-sectional view illustrating a cross-section C of FIG. 2.

As illustrated in FIG. 2 and (b) of FIG. 3, the first slit S1 and the second slit S2 are not superimposed on each other in the vicinity of the region (the normal portion TU) described as the cross-section B in the drawings. Note that the first slit S1 is formed in the first inorganic insulating film 7, the second inorganic insulating film 8 is formed in the first slit S1, and the metal film 29 is formed in the lower layer of the second inorganic insulating film 8. The second slit S2 is formed in the second inorganic insulating film 8, and a flattening film 31 is formed in the second slit S2.

The first slit S1 and the second slit S2 are formed so as to gradually approach the vicinity of the region IK, and are formed so as to merge at a position denoted as GS6' in the region IK in FIG. 2. As illustrated in (a) of FIG. 3, in the regions indicated by the "cross-section A" in FIG. 2, the merging slit GS6' where the first slit S1 and the second slit S2 merge is formed in the region indicated by GS6'. In addition, the merging slit GS6' is formed in the region indicated by GS6' in FIG. 2 and (c) of FIG. 3.

By providing the merging slit in this way, the width between the end face of the first slit S1 and the end face of the second slit S2 indicated by A1 in FIG. 2 and (b) of FIG. 3 is greater than the width of the merging slit GS6' indicated by A2 in FIG. 2 and (c) of FIG. 3.

In other words, a length (A1) of a first perpendicular line from a side of the first slit S1 that is a side not facing a side of the second slit S2 down to a side of the second slit S2 that is a side not facing the side of the first slit S1 in the frame region NA where the first slit S1 and the second slit S2 do not form the merging slit GS6 when the display device 1' is viewed from vertically above, and a length (A2) of a second perpendicular line from one side of the merging slit GS6 down to the other side facing thereto in the frame region NA in which the first slit S1 and the second slit S2 form the merging slit GS6 when the display device 1 is viewed from vertically above preferably satisfy the following formula (1).

Length($A1$) of first perpendicular line>length($A2$) of second perpendicular line       Formula (1)

In the frame region, the region IK is more likely to crack than the normal portion. By providing a configuration satisfying Formula (1), the width of the region indicated by B2 in FIG. 2 can be ensured while the frame region is made as narrow as possible. Therefore, the generation of cracks in the region IK can be suppressed.

In (a) of FIG. 1, the merging slits GS1 and GS6 are provided in the frame region NA (the region IK) between the corner portion R (the end portion of the display device 1) positioned at two upper portions of the display device 1 and the corner portion W which is the deformed portion of the display region DA, and four merging slits indicated by GS2 to GS5 are provided in the frame region NA (the region IK) between the notch portion K1 (the end portion of the display device 1) and the notch portion K2, which is the deformed portion of the display region DA, It is obvious that the position and number of the merging slits are not limited thereto. For example, in the region IK illustrated in (a) of FIG. 1, the merging slit may be provided at a position different from GS1 to GS6. In addition, when other deformed portions that differ from the deformed portions illustrated in (a) of FIG. 1 is included in the display device 1, the occurrence of cracks in the regions IK can be effectively suppressed, as described above, by forming the merging slit in each of the regions IK.

The merging slit can be formed by adjusting the positions of the first and second slits so that the first and second slits merge to form one slit in the region IK where the merging slit is to be formed using a method such as photolithography described above as a method for extracting portions of the first inorganic insulating film and the second insulating film.

In the display device 1', the width of the first slit S1 indicated by A3 in FIG. 2 and (b) of FIG. 3 is preferably smaller than the width of the merging slit GS6' indicated by A2 in FIG. 2 and FIG. 3(c), and the width of the second slit S2 indicated by A4 in FIG. 2 and FIG. 3(d) is preferably smaller than the width of the merging slit GS6'.

In other words, when the display device 1' is viewed from vertically above, a length (A3) of the third perpendicular line from one side of the first slit S1 down to the other side facing thereto in the frame region NA in which the first slit S1 and the second slit S2 do not form the merging slit GS6' is preferably smaller than the length (A2) of the second perpendicular line, and a length (A4) of the fourth perpendicular line from one side of the second slit S2 down to the other side facing thereto is preferably smaller than the length (A2) of the second perpendicular line. Note that the length (A3) of the third perpendicular line does not include the length of the metal film 29.

With this configuration, a space occupied by the first slit S1 and the second slit S2 is reduced in the region IK where cracks are easily generated, and the width of the region indicated by B2 in FIG. 2 can be ensured. Therefore, the generation of cracks in the region IK can be suppressed.

In the display device 1', the width (B1) of the end portion of the display device 1 and the end portion of the first slit S1, indicated by B1 in FIG. 2, is preferably smaller than the width (B2) of the end portion of the display device and the end portion of the merging slit GS6', indicated by B2 in FIG. 2.

In other words, a length (B1) of a fifth perpendicular line from an end portion of the display device 1' down to a side facing the end portion of the display device 1' of the slit facing the end portion of the display device 1' in the first slit S1 and the second slit S2, in the frame region NA where the first slit S1 and the second slit S2 do not form the merging slit GS6' when the display device 1' is viewed from vertically above, and a length (B2) of a sixth perpendicular line from an end portion of the display device 1' down to a side facing the end portion of the display device 1' in the sides of the merging slit GS6', in the frame region NA where the first slit S1 and the second slit S2 form the merging slit GS6' when the display device 1' is viewed from vertically above preferably satisfy the following formula (2).

Length($B1$) of fifth perpendicular line<length($B2$) of sixth perpendicular line       Formula (2)

In the frame region, the region IK is more likely to crack than the normal portion. By providing the configuration satisfying Formula (2), the width of the region indicated by B2 in FIG. 2 can be ensured while the frame region is made as narrow as possible. Therefore, the generation of cracks in the region IK can be suppressed.

Instead of having the configuration satisfying Formula (2), it is also preferable that the display device 1' has a configuration in which the width of the second slit S2 and the end portion of the display region DA indicated by D1 in FIG. 2 is smaller than the width of the merging slit GS6' and the end portion of the display region DA indicated by D2 in FIG. 2.

In other words, a length (D1) of a seventh perpendicular line from the end portion of the display region DA down to a side facing the end portion of the display region DA of the slit facing the end portion of the display region DA in the first slit S1 and the second slit S2 in the frame region NA where the first slit S1 and the second slit S2 do not form the merging slit GS6' when the display device 1' is viewed from vertically above, and a length (D2) of the eighth perpendicular line from the end portion of the display region DA down to a side facing the end portion of the display region DA of the sides of the merging slit GS6 in the frame region NA where the first slit S1 and the second slit S2 form the merging slit GS6 when the display device 1' is viewed from vertically above, preferably satisfy the following formula (3).

$$\text{Length}(D1) \text{ of seventh perpendicular line} < \text{length} (D2) \text{ of eighth perpendicular line} \qquad \text{Formula (3)}$$

Note that "an end portion of the display region DA" refers to a portion that forms the outermost line of the display region DA in a plan view when the display device 1 is viewed from vertically above. For example, the portion indicated by the dotted line in DA of FIG. 2 is included.

By providing the configuration satisfying Formula (3), the control circuit can be provided between the merging slit GS6' and the display region DA in the region IK while the frame region is narrowed as possible.

Hereinabove, while the positional relationship and the like between the first slit S1 and the second slit S2 have been described using the merging slit GS6' formed in the portion of the frame region NA sandwiched between the corner portion R (the end portion of the display device 1') and the corner portion R' which is an deformed portion of the display region DA, illustrated in FIG. 2 as an example, it is not limited thereto. For example, in (a) of FIG. 1, it can be said that the merging slits GS2 to GS5 formed in the frame region NA sandwiched between the notch portion K1 (the end portion of the display device 1) and the notch portion K2, which is a deformed portion of the display region DA, and the merging slits GS1 and (356 illustrated in (a) of FIG. 1 are the same as the above-mentioned description.

5. Metal Film

For example, as illustrated in (d) of FIG. 1, when the first slit S1 is covered with the second inorganic insulating film 8, the metal film 29 is preferably formed in the first slit S1 in the lower layer of the second inorganic insulating film 8 to be superimposed with the first slit S1.

According to this configuration, a pressure wave propagates through the metal film, but because the metal film is ductile, cracks are less likely to occur than the inorganic insulating film. Therefore, the cracks from the first inorganic insulating film 7 are less likely to be formed in the second inorganic insulating film 8. For example, a layer formed by the gate electrode GE, the capacitance wiring line CE, the source electrode and drain electrode SH, and the like, can be used as the metal film.

The metal film 29 is formed to cover the first slit S1, as illustrated in FIG. 2, (a) and (b) of FIG. 3, but is preferably not superimposed on the merging slit GS6' as illustrated in FIG. 2 and (a) of FIG. 3. This is because, when the metal film 29 is superimposed on the merging slit GS6', the pressure wave propagates through the metal film 29 to the merging slit GS6' and can cause cracking in the region IK. However, in the merging slit GS6', the metal film 29 may be provided with a staggered opening.

6. Formation of Film into Slit

In (d) of FIG. 1, the second inorganic insulating film 8 is formed in the first slit S1. In other words, the first slit S1 is covered with the second inorganic insulating film 8, and the first inorganic insulating film 7 is exposed from the second slit S2. According to this configuration, the progression of cracks can be suppressed and reliability against moisture and oxygen permeation can be ensured, and thus, it is preferable. In this case, since the first slit S1 has an interface between the first inorganic insulating film 7 and the second inorganic insulating film 8, transmission of cracks that have progressed through the first inorganic insulating film 7 to the second inorganic insulating film 8 can be suppressed.

The first slit S1 and the second slit S2 may be covered with the resin layer. For example, in (d) of FIG. 1, instead of the second inorganic insulating film 8 formed in the first slit S1, a flattening film 31 may be formed (in other words, a slit of the second inorganic insulating film 8 may also be formed in the first slit), and the flattening film 31 may be layered on the second inorganic insulating film 8 formed in the first slit S1 as illustrated in (e) of FIG. 1. Alternatively, in (d) of FIG. 1, the flattening film 31 may be layered on the second slit S2.

In these cases, cracks that have progressed through the interior of the first inorganic insulating film 7 and cracks that have progressed through the interior of the second inorganic insulating film 8 are less likely to be transmitted to the flattening film 31 formed of a resin material such as a polyimide resin.

Furthermore, as illustrated in (e) of FIG. 1, the flattening film 31 may be formed in the first slit S1 and the second slit S2, and the flattening film 31 may be formed to cover the entire upper surface of the second inorganic insulating film 8. Examples of the material of the flattening film 31 include a polyimide resin, an epoxy resin, and a polyamide resin, but are not limited thereto. The flattening film 31 corresponds to the resin layer.

Second Embodiment

In a display device 1a according to a second embodiment, a third slit S3 is formed in a first inorganic insulating film 7 so as to be superimposed on a second slit S2, and a fourth slit S4 is formed in a second inorganic insulating film 8 so as to be superimposed on a first slit S1.

The first slit S1, the second slit S2, the third slit S3, and the fourth slit S4 are preferably covered with a resin layer.

Figure 4:
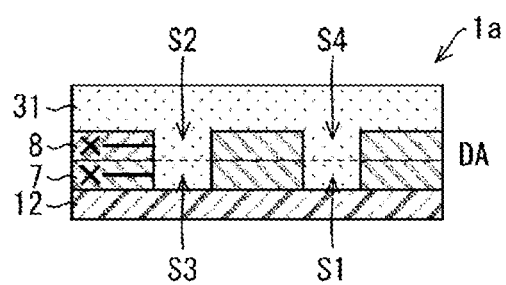
FIG. 4 is a cross-sectional view of a display device according to a second embodiment, illustrating only a first inorganic insulating film, a second inorganic insulating film, a flattening film, a first slit, a second slit, a third slit, a fourth slit, and a resin layer.

FIG. 4 is a view illustrating only the first inorganic insulating film 7, the second inorganic insulating film 8, the flattening film 31, the first slit S1, the second slit S2, the third slit S3, the fourth slit S4, and a resin layer 12 of the display device 1a in the cross-sectional view taken at a position corresponding to line L3-L4 in (a) of FIG. 1. The flattening film 31 corresponds to the above-mentioned resin layer that covers the first slit S1 to the fourth slit S4.

The second slit S2 is a slit formed by extracting a portion of the second inorganic insulating film 8 to a dotted line portion in FIG. 4. The third slit S3 is a slit formed by also extracting the first inorganic insulating film 7, which is the lower layer of the second slit S2, and is a slit formed in a region from the bottom surface of the first inorganic insulating film 7 to a dotted line portion at a location indicated by "S3" in FIG. 4.

The first slit S1 is a slit formed by extracting the first inorganic insulating film 7 from the bottom surface to the dotted line portion at a place indicated by "S1" in FIG. 4. The fourth slit S4 is a slit formed by extracting the second inorganic insulating film 8 formed at a place indicated as "S1". The same method as the method for forming the first slit S1 and the second slit S2 can be used as a method for forming the third and fourth slits S3 and S4.

As described above, the display device 1a includes slits formed by extracting the first inorganic insulating film 7 and the second inorganic insulating film 8 together. For this reason, cracks that have progressed from the starting point indicated by signs x in FIG. 4 to the interior of the first inorganic insulating film 7 and the second inorganic insulating film 8 can be suppressed at the same position. Therefore, the progression of cracks can be effectively suppressed in a narrow range.

The display device 1a has the same configuration as the display device 1 according to the first embodiment, except that the third and fourth slits S3 and S4 are formed. Accordingly, the merging slit or the like described in the display device 1 can be provided.

Note that the first slit S1 and the fourth slit S4 and the second slit S2 and the third slit S3 are not limited to the case where the end portions of the slits are aligned as illustrated in FIG. 4, and if at least the first slit S1 and the fourth slit S4 are superimposed on each other, and the second slit S2 and the third slit S3 are superimposed on each other, the progression of cracks can be suppressed.

Third Embodiment

Figure 5:
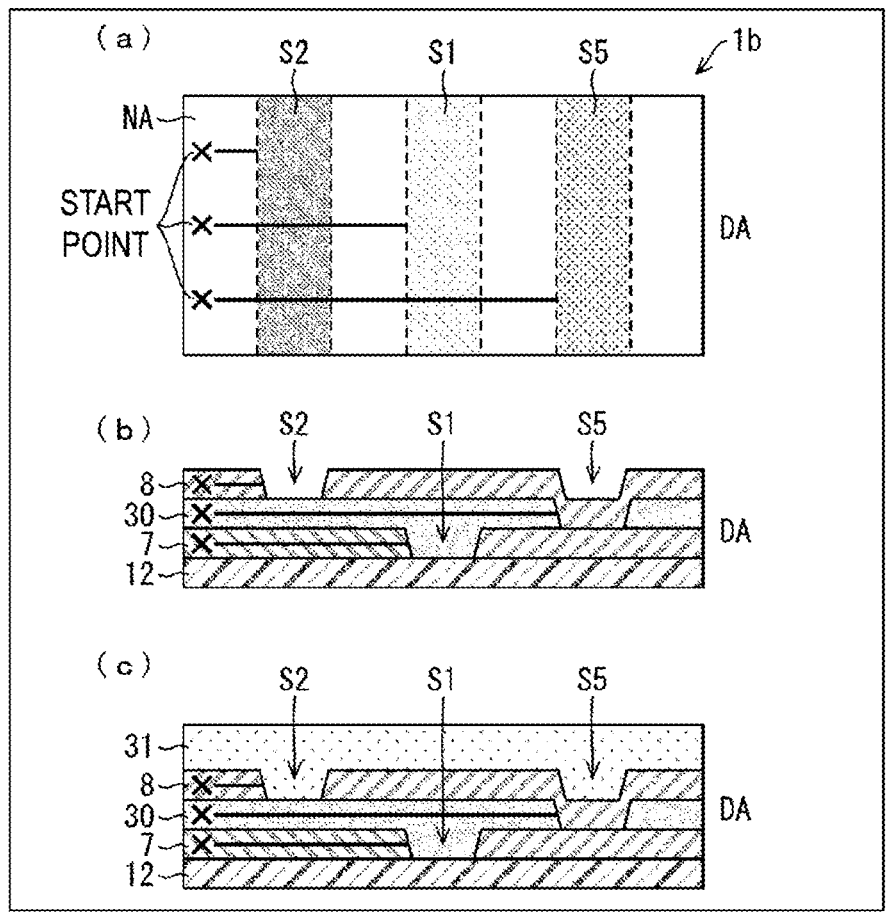
FIG. 5 (a) is a plan view of a display device according to a third embodiment.
Figure 6:
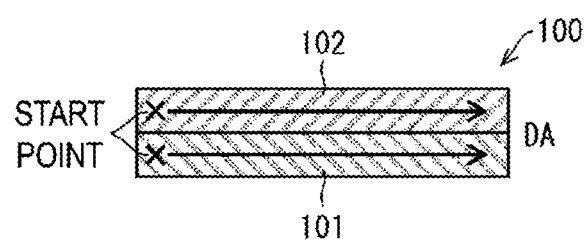
FIG. 6 is a schematic view illustrating progression of cracks generated in a layered structure formed by two layers of inorganic insulating films provided in a frame region of a display device in the related art.

A display device 1b according to a third embodiment includes an organic layer 30 between a first inorganic insulating film 7 and a second inorganic insulating film 8, and a fifth slit S5 is formed in the organic layer 30. (a) of FIG. 5 is a plan view of the display device 1b in the vicinity of a position corresponding to line L3-L4 illustrated in (a) of FIG. 1. (b) of FIG. 5 is a view illustrating only the first inorganic insulating film 7, the second inorganic insulating film 8, the organic layer 30, a first slit S1, a second slit S2, a fifth slit S5, and a resin layer 12 in a cross-sectional view of the display device 1b cut at a position corresponding to the line L3-L4 illustrated in (a) of FIG. 1. (c) of FIG. 5 illustrates the display device 1b in which the flattening film 31 is formed.

Examples of the material of the organic layer 30 include a polyimide resin, an epoxy resin, a polyamide resin, and the like, but are not limited thereto.

The organic layer 30 is formed of a resin material, but rarely cracks may be generated and affect the display. Since the fifth slit S5 is formed in the organic layer 30, in the display device 1b, cracks that progress from the starting point indicated by the signs x to the interior of the organic layer 30 as illustrated in (b) and (c) of FIG. 5 can be suppressed by the fifth slit S5. In addition, moisture permeation can also be prevented. In other words, the display device 1b is useful because it is possible to prevent the progression of cracks and the permeation of moisture even when the organic layer is formed between the first inorganic insulating film and the second inorganic insulating film.

The disclosure is not limited to each of the embodiments described above, and various modifications may be made within the scope of the claims. Embodiments obtained by appropriately combining technical approaches disclosed in each of the different embodiments also fall within the technical scope of the disclosure. Furthermore, novel technical features can be formed by combining the technical approaches disclosed in the embodiments.

INDUSTRIAL APPLICABILITY

The disclosure can be utilized for a display device.

The invention claimed is:

1. A display device comprising:
a resin layer;
a thin film transistor layer formed on the resin layer, the thin film transistor layer including a first inorganic insulating film and a second inorganic insulating film;
a light-emitting element layer;
a sealing layer;
a display region; and
a frame region surrounding the display region,
wherein the first inorganic insulating film and the second inorganic insulating film are each formed of one type of an inorganic insulating film or two or more types of layered inorganic insulating films,
the second inorganic insulating film is layered on the first inorganic insulating film,
in the frame region, a first slit is formed in the first inorganic insulating film, a second slit is formed in the second inorganic insulating film, and the first slit and the second slit are partially superimposed on each other,
in a plan view, an edge of the display region has a first curved portion, an edge of the display device has a second curved portion corresponding to the first curved portion, the first slit and the second slit are formed so as to approach each other at a vicinity of a part of the frame region between the first curved portion and the second curved portion, and in the part of the frame region between the first curved portion and the second curved portion, a portion of the first slit and a portion of the second slit are superimposed to form a merging slit,
a length of a first perpendicular line and a length of a second perpendicular line satisfy a following formula (1), the length of the first perpendicular line>the length of the second perpendicular line    Formula (1), the length of the first perpendicular line being a length from a side of the first slit that does not face a side of the second slit down to a side of the second slit that does not face the side of the first slit, in the frame region where the first slit and the second slit do not form the merging slit, when the display device is viewed from vertically above,
the length of the second perpendicular line being a length from one side of the merging slit down to the other side facing the one side, in the frame region where the portion of the first slit and the portion of the second slit form the merging slit, when the display device is viewed from vertically above, and
when the display device is viewed from vertically above, in the frame region where the first slit and the second slit do not form the merging slit,
a length of a third perpendicular line is smaller than the length of the second perpendicular line, the length of the third perpendicular line being a length from one side of the first slit down to another side facing the one side, and
a length of a fourth perpendicular line is smaller than the length of the second perpendicular line, the length of the fourth perpendicular line being a length from one side of the second slit down to another side facing the one side.

2. The display device according to claim 1,
wherein each of the first slit and the second slit is formed and surrounds the display region.

3. The display device according to claim 1,
wherein a length of a fifth perpendicular line and a length of a sixth perpendicular line satisfy a following formula (2), $$\text{the length of the fifth perpendicular line} < \text{the length of the sixth perpendicular line} \quad \text{Formula (2)},$$

the length of the fifth perpendicular line being a length from an end portion of the display device down to a side facing the end portion of a slit facing the end portion in the first slit and the second slit, in the frame region where the first slit and the second slit do not form the merging slit, when the display device is viewed from vertically above, and the length of the sixth perpendicular line being a length from the end portion of the display device down to a side facing the end portion of sides of the merging slit, in the frame region where the portion of the first slit and the portion of the second slit form the merging slit, when the display device is viewed from vertically above.

4. The display device according to claim 1,
wherein a length of a seventh perpendicular line and a length of an eighth perpendicular line satisfy a following formula (3), $$\text{the length of the seventh perpendicular line} < \text{the length of the eighth perpendicular line} \quad \text{Formula (3)},$$

the length of the seventh perpendicular line being a length from an end portion of the display region down to a side facing the end portion of a slit facing the end portion in the first slit and the second slit, in the frame region where the first slit and the second slit do not form the merging slit, when the display device is viewed from vertically above, and the length of the eighth perpendicular line being a length from the end portion of the display region down to a side facing the end portion in sides of the merging slit, in the frame region where the portion of the first slit and the portion of the second slit form the merging slit, when the display device is viewed from vertically above.

5. The display device according to claim 1,
wherein the first slit is covered with the second inorganic insulating film, and the first inorganic insulating film is exposed from the second slit.

6. The display device according to claim 1,
wherein the first slit and the second slit are covered with the resin layer.

7. The display device according to claim 1,
wherein a metal film is formed in a layer lower than the second inorganic insulating film, the metal film being superimposed with the first slit.

8. The display device according to claim 1,
wherein a third slit is formed in the first inorganic insulating film, the third slit being superimposed with the second slit, and
a fourth slit is formed in the second inorganic insulating film, the fourth slit being superimposed with the first slit.

9. The display device according to claim 8,
wherein the first slit, the second slit, the third slit, and the fourth slit are covered with the resin layer.

10. The display device according to claim 1,
wherein the first slit is provided at a position closer to an end portion of the display device than the second slit in the frame region.

11. The display device according to claim 1,
wherein the first inorganic insulating film is one type of an inorganic insulating film or two or more types of layered inorganic insulating films selected from a group consisting of a base coat film, a gate insulating film, a first interlayer insulating film, a second interlayer insulating film, and a semiconductor film.

12. The display device according to claim 1,
wherein the second inorganic insulating film is one type of an inorganic insulating film or two or more types of layered inorganic insulating films selected from a group consisting of a gate insulating film, a first interlayer insulating film, a second interlayer insulating film, and a semiconductor film.

13. The display device according to claim 1, further comprising an organic layer between the first inorganic insulating film and the second inorganic insulating film, wherein a fifth slit is formed in the organic layer.

14. A display device comprising:
a resin layer;
a thin film transistor layer formed on the resin layer, the thin film transistor layer including a first inorganic insulating film and a second inorganic insulating film;
a light-emitting element layer;
a sealing layer;
a display region; and
a frame region surrounding the display region,
wherein the first inorganic insulating film and the second inorganic insulating film are each formed of one type of an inorganic insulating film or two or more types of layered inorganic insulating films, the second inorganic insulating film is layered on the first inorganic insulating film,
in the frame region, a first slit is formed in the first inorganic insulating film, a second slit is formed in the second inorganic insulating film, and the first slit and the second slit are partially superimposed on each other,
in a plan view, an edge of the display region has a first curved portion, an edge of the display device has a second curved portion corresponding to the first curved portion, the first slit and the second slit are formed so as to approach each other at a vicinity of a part of the frame region between the first curved portion and the second curved portion, and in the part of the frame region between the first curved portion and the second curved portion, a portion of the first slit and a portion of the second slit are superimposed to form a merging slit,
a length of a fifth perpendicular line and a length of a sixth perpendicular line satisfy a following formula (2), $$\text{the length of the fifth perpendicular line} < \text{the length of the sixth perpendicular line} \quad \text{Formula (2)},$$

the length of the fifth perpendicular line being a length from an end portion of the display device down to a side facing the end portion of a slit facing the end portion in the first slit and the second slit, in the frame region where the first slit and the second slit do not form the merging slit, when the display device is viewed from vertically above, and the length of the sixth perpendicular line being a length from the end portion of the display device down to a side facing the end portion of sides of the merging slit, in the frame region where the portion of the first slit and the portion of the second slit form the merging slit, when the display device is viewed from vertically above.

15. The display device according to claim 14, wherein a length of a first perpendicular line and a length of a second perpendicular line satisfy a following formula (1), $$\text{the length of the first perpendicular line} > \text{the length of the second perpendicular line} \qquad \text{Formula (1),}$$

the length of the first perpendicular line being a length from a side of the first slit that does not face a side of the second slit down to a side of the second slit that does not face the side of the first slit, in the frame region where the first slit and the second slit do not form the merging slit, when the display device is viewed from vertically above, and the length of the second perpendicular line being a length from one side of the merging slit down to the other side facing the one side, in the frame region where the portion of the first slit and the portion of the second slit form the merging slit, when the display device is viewed from vertically above.

16. The display device according to claim 14, wherein, when the display device is viewed from vertically above, in the frame region where the first slit and the second slit do not form the merging slit,
   a length of a third perpendicular line is smaller than a length of a second perpendicular line, the length of the third perpendicular line being a length from one side of the first slit down to another side facing the one side, and
   a length of a fourth perpendicular line is smaller than the length of the second perpendicular line, the length of the fourth perpendicular line being a length from one side of the second slit down to another side facing the one side, and
the length of the second perpendicular line being a length from one side of the merging slit to another side facing the one side, in the frame region where the portion of the first slit and the portion of the second slit form the merging slit, when the display device is viewed from vertically above.

17. A display device comprising:
a resin layer;
a thin film transistor layer formed on the resin layer, the thin film transistor layer including a first inorganic insulating film and a second inorganic insulating film;
a light-emitting element layer;
a sealing layer;
a display region; and
a frame region surrounding the display region,
wherein the first inorganic insulating film and the second inorganic insulating film are each formed of one type of an inorganic insulating film or two or more types of layered inorganic insulating films, the second inorganic insulating film is layered on the first inorganic insulating film,
in the frame region, a first slit is formed in the first inorganic insulating film, a second slit is formed in the second inorganic insulating film, and the first slit and the second slit are partially superimposed on each other,
in a plan view, an edge of the display region has a first curved portion, an edge of the display device has a second curved portion corresponding to the first curved portion, the first slit and the second slit are formed so as to approach each other at a vicinity of a part of the frame region between the first curved portion and the second curved portion, and in the part of the frame region between the first curved portion and the second curved portion, a portion of the first slit and a portion of the second slit are superimposed to form a merging slit, a length of a seventh perpendicular line and a length of an eighth perpendicular line satisfy a following formula (3), $$\text{the length of the seventh perpendicular line} < \text{the length of the eighth perpendicular line} \qquad \text{Formula (3),}$$

the length of the seventh perpendicular line being a length from an end portion of the display region down to a side facing the end portion of a slit facing the end portion in the first slit and the second slit, in the frame region where the first slit and the second slit do not form the merging slit, when the display device is viewed from vertically above, and the length of the eighth perpendicular line being a length from the end portion of the display region down to a side facing the end portion in sides of the merging slit, in the frame region where the portion of the first slit and the portion of the second slit form the merging slit, when the display device is viewed from vertically above.

18. The display device according to claim 17, wherein a length of a first perpendicular line and a length of a second perpendicular line satisfy a following formula (1), $$\text{the length of the first perpendicular line} > \text{the length of the second perpendicular line} \qquad \text{Formula (1),}$$

the length of the first perpendicular line being a length from a side of the first slit that does not face a side of the second slit down to a side of the second slit that does not face the side of the first slit, in the frame region where the first slit and the second slit do not form the merging slit, when the display device is viewed from vertically above, the length of the second perpendicular line being a length from one side of the merging slit down to the other side facing the one side, in the frame region where the portion of the first slit and the portion of the second slit form the merging slit, when the display device is viewed from vertically above.

19. The display device according to claim 17, wherein, when the display device is viewed from vertically above, in the frame region where the first slit and the second slit do not form the merging slit,
   a length of a third perpendicular line is smaller than a length of a second perpendicular line, the length of the third perpendicular line being a length from one side of the first slit down to another side facing the one side, and
   a length of a fourth perpendicular line is smaller than the length of the second perpendicular line, the length of the fourth perpendicular line being a length from one side of the second slit down to another side facing the one side, and
the length of the second perpendicular line being a length from one side of the merging slit to another side facing the one side, in the frame region where the portion of the first slit and the portion of the second slit form the merging slit, when the display device is viewed from vertically above.

* * * * *